United States Patent
Schoess et al.

(10) Patent No.: US 7,003,873 B2
(45) Date of Patent: *Feb. 28, 2006

(54) METHOD OF MAKING CONFORMAL FLUID DATA SENSOR

(75) Inventors: Jeffrey N. Schoess, Buffalo, MN (US); Mark D. Simons, Rio Rancho, NM (US)

(73) Assignee: Honeywell International, Inc., Morristown, NJ (US)

( * ) Notice: Subject to any disclaimer, the term of this patent is extended or adjusted under 35 U.S.C. 154(b) by 203 days.

This patent is subject to a terminal disclaimer.

(21) Appl. No.: 10/672,380

(22) Filed: Sep. 26, 2003

(65) Prior Publication Data

US 2004/0194300 A1    Oct. 7, 2004

Related U.S. Application Data

(62) Division of application No. 09/757,443, filed on Jan. 9, 2001, now Pat. No. 6,662,647.

(51) Int. Cl.
    *H05K 3/30* (2006.01)
(52) U.S. Cl. .......................... 29/832; 29/595; 29/825; 29/846; 73/170.02
(58) Field of Classification Search .............. 29/825, 29/832, 846, 595; 73/170.02
See application file for complete search history.

(56) References Cited

U.S. PATENT DOCUMENTS

| 4,668,314 A * | 5/1987 | Endoh et al. ................. 156/64 |
| 6,181,989 B1 * | 1/2001 | Gwozdecki ..................... 701/4 |
| 6,646,316 B1 * | 11/2003 | Wu et al. .................... 257/434 |
| 6,662,647 B1 * | 12/2003 | Schoess et al. .......... 73/170.02 |
| 6,868,314 B1 * | 3/2005 | Frink ............................ 701/3 |
| 6,885,107 B1 * | 4/2005 | Kinsman .................... 257/778 |

* cited by examiner

*Primary Examiner*—Carl J. Arbes
(74) *Attorney, Agent, or Firm*—Faegre & Benson LLP

(57) ABSTRACT

A method of making a gaseous fluid data sensor assembly for acquiring data regarding the ambient environment adjacent a surface of an airframe with adjacent air speeds below 40 knots (or another aerodynamic structure with low speed gaseous fluid flow adjacent thereto) having a flexible substrate adhesively conforming to the airframe surface, a conformable cover layer and a relatively thin air data sensor for sensing air pressure between the substrate and the cover layer. The method includes forming a flexible printed circuit on a polymeric film, attaching thin air data sensor to the printed circuit and attaching a flexible substrate to form a conformal air data sensor. The method may also include attaching a data acquisition circuit to the printed circuit and may still further include providing an optical interconnection between the air data sensor and the data acquisition circuit.

22 Claims, 12 Drawing Sheets

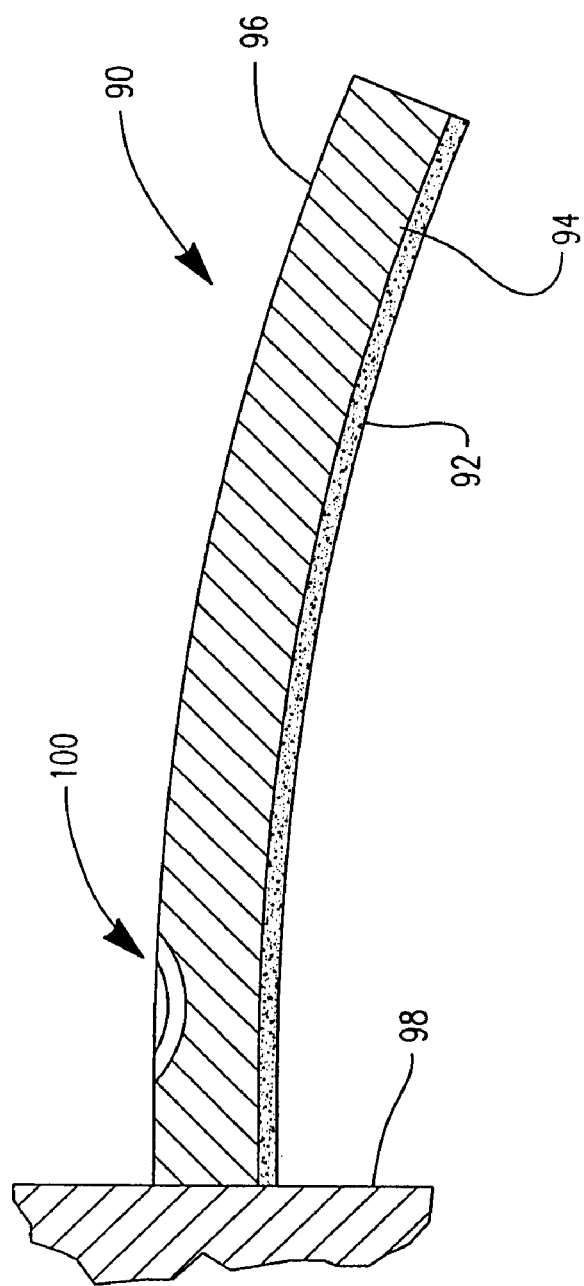

METHOD OF MAKING CONFORMAL FLUID DATA SENSOR

CROSS-REFERENCE TO RELATED APPLICATION

This application is a division of U.S. patent application Ser. No. 09/757,443, titled Conformal Fluid Data Sensor, filed Jan. 9, 2001 now U.S. Pat. No. 6,662,647. This application claims the benefit of and expressly incorporates by reference the entirety of U.S. patent application Ser. No. 09/757,443.

FIELD OF THE INVENTION

The present invention relates to the field of fluid data sensing, including airborne vehicle instrumentation, more particularly, to sensors for measuring one or more ambient air parameters adjacent an airflow structure such as an airfoil of an aeronautical structure or an airflow structure in a gaseous fluid flow apparatus such as (but not limited to) a forced air convection heating system.

BACKGROUND OF THE INVENTION

The aviation community has needed ambient air parameter measurements since the advent of instrumented flight. However, prior art sensor technology was typically not able to provide sufficient resolution in a utilitarian form and at an affordable cost for measurement of dynamic pressures associated with air speeds below 40 knots. For this reason, helicopters and V/STOL (vertical/short takeoff and landing) aircraft used active sensing technologies such as radar and laser optical systems with consequent increases in complexity and cost and attendant issues of reliability. In addition, prior art air data sensors characteristically had salient (projecting) profiles with respect to the structural members to which they were attached. The present invention overcomes such shortcomings of the prior art by providing an apparatus capable of measuring temperature and pressure with high resolution regardless of dynamic pressure, in harsh environments and at extreme temperatures while having a streamlined profile integrated with or conforming to the aerodynamic structure on which it is mounted. As used herein, airborne vehicle and aeronautical structure each mean any apparatus intended for passage through air, around which air may be conducted, or through which air is intended to pass, such as aircraft (whether fixed wing or rotary wing), spacecraft, self-powered and un-powered- projectiles (such as missiles and artillery projectiles), and gaseous fluid propulsion machinery (such as turbo-machinery, jet engines, rocket engines, and the like).

BRIEF DESCRIPTION OF THE DRAWINGS

FIG. 12 is a section view of a cantilevered microbeam shown to illustrate a temperature sensor useful in the practice of the present invention.

DETAILED DESCRIPTION OF THE INVENTION

Figure 1:
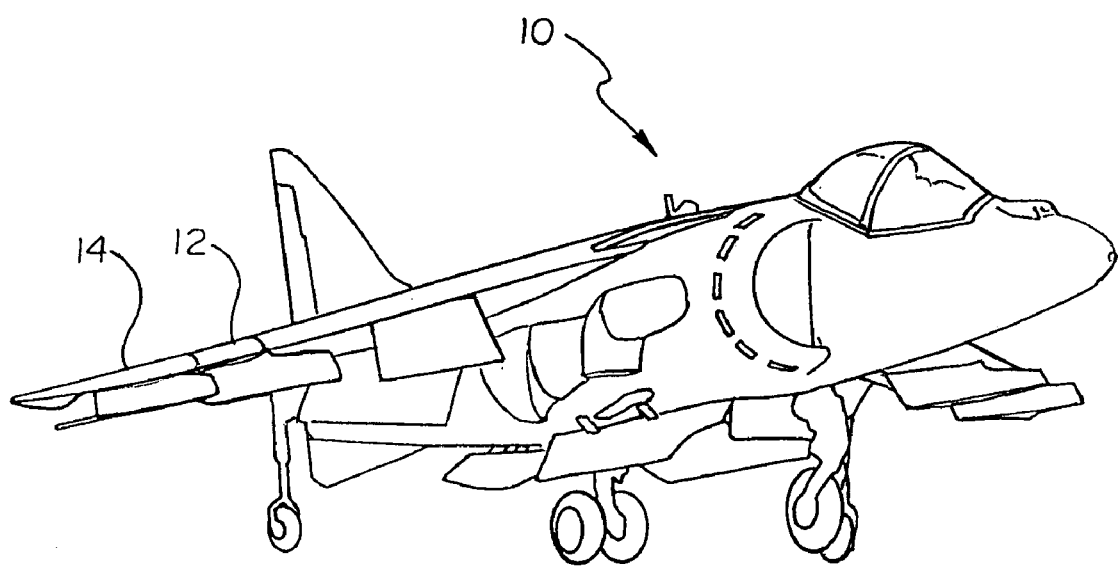
FIG. 1 is a perspective view from below, forward and to the right of an AV-8B Harrier II aircraft useful in the practice of the present invention.
Figure 2:
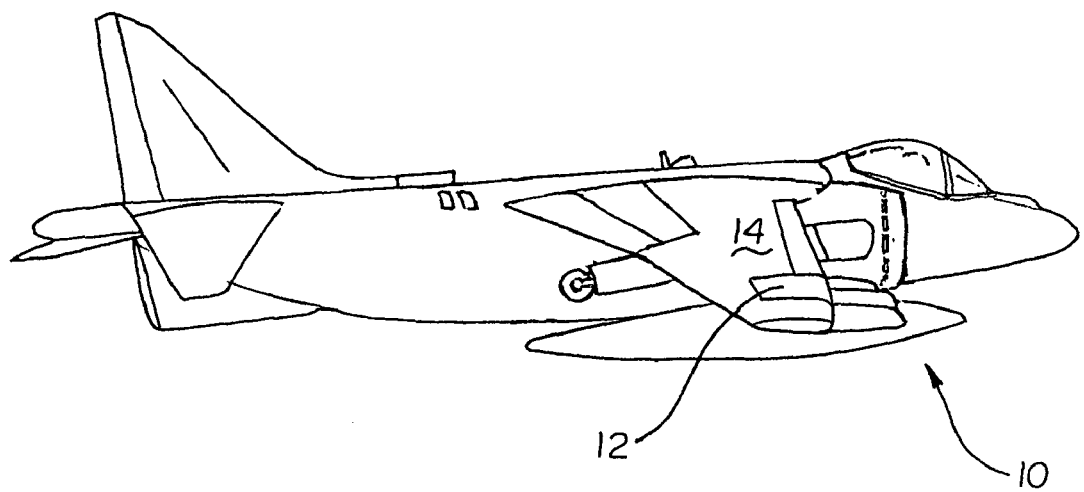
FIG. 2 is a view similar to that of FIG. 1, except from above, slightly aft and to the right to illustrate an example application of the present invention on the upper surface of the wing of the aircraft.
Figure 3:
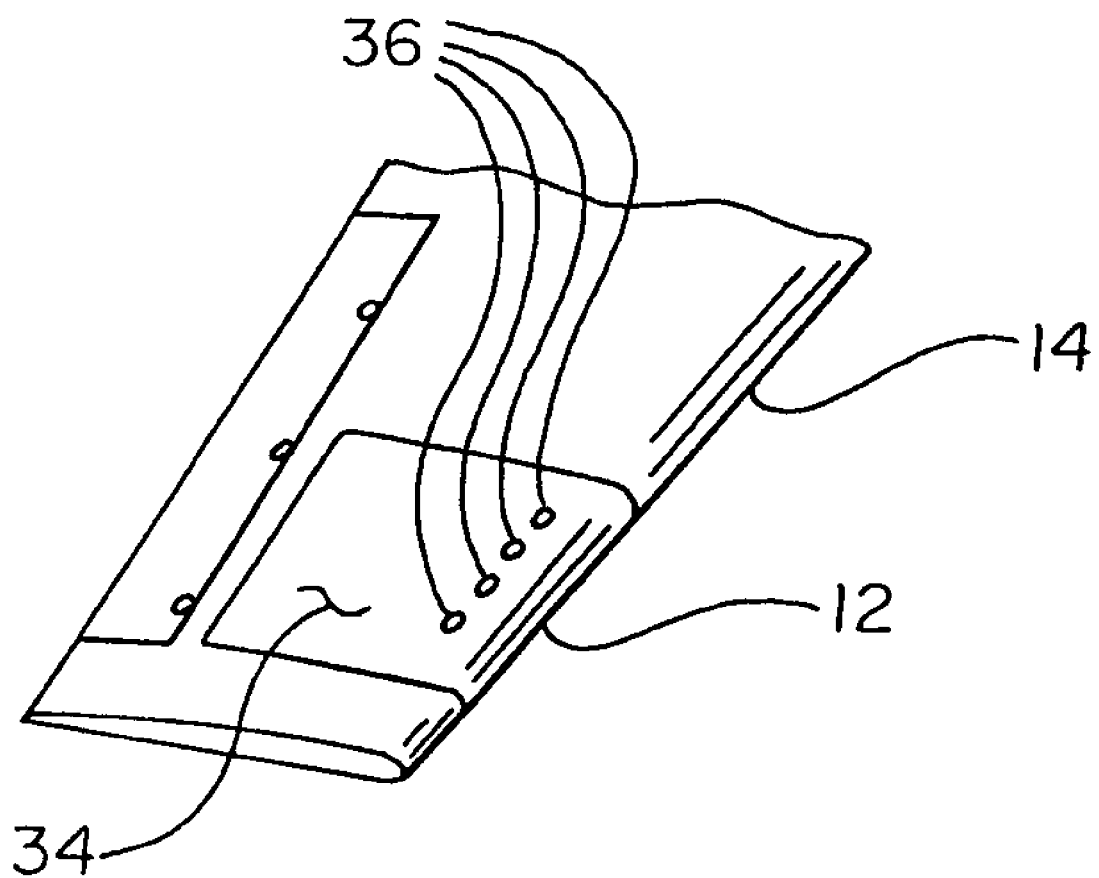
FIG. 3 is a simplified enlarged, fragmentary perspective view of a wing showing an application of the present invention.

Referring now to the Figures, and most particularly to FIGS. 1 and 2, an AV-8B Harrier V/STOL type aircraft 10, as manufactured by The Boeing Company, is shown. Referring now also to FIG. 3, the present invention is shown as a relatively thin patch 12 or layer over part of a wing 14 of the aircraft 10. It is to be understood that the present invention is useful in connection with various airborne vehicles, such as aircraft, rockets and missiles, and projectiles. Such vehicles may be manned or unmanned. The Harrier aircraft is used as an illustration or example application inasmuch as it operates at airspeeds below 40 knots during takeoff and landing. The streamlined aspect of the present invention is useful at higher airspeeds to reduce drag and turbulence.

Figure 4:
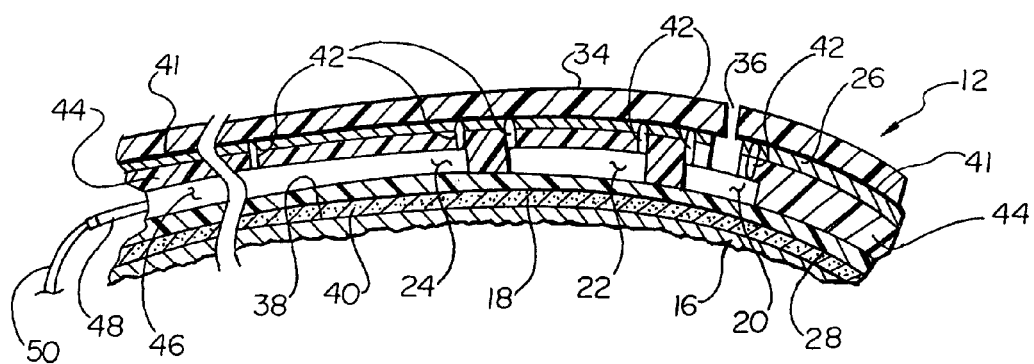
FIG. 4 is a cross sectional view of the present invention as it would appear installed on a wing as shown in FIGS. 2 and 3.

Referring now most particularly to FIG. 4, a cross-section view of the air data sensor assembly 12 may be seen. In this view, the assembly 12 is bonded to a portion 16 of the wing 14 via an adhesive layer 18. A pressure sensor 20 is located within the assembly 12. A data acquisition circuit 22 and battery 24 are also preferably located within assembly 12. The sensor 20, circuit 22, and battery 24 are mechanically and electrically interconnected via a flexible printed circuit layer 26. Battery 24 is preferably a ½ mil thick polymer rechargeable lithium battery available from Ultralife Battery, Inc. having an address at 2000 Technology Parkway, Newark, N.Y. 14513 as part number: EL 27.

Figure 5:
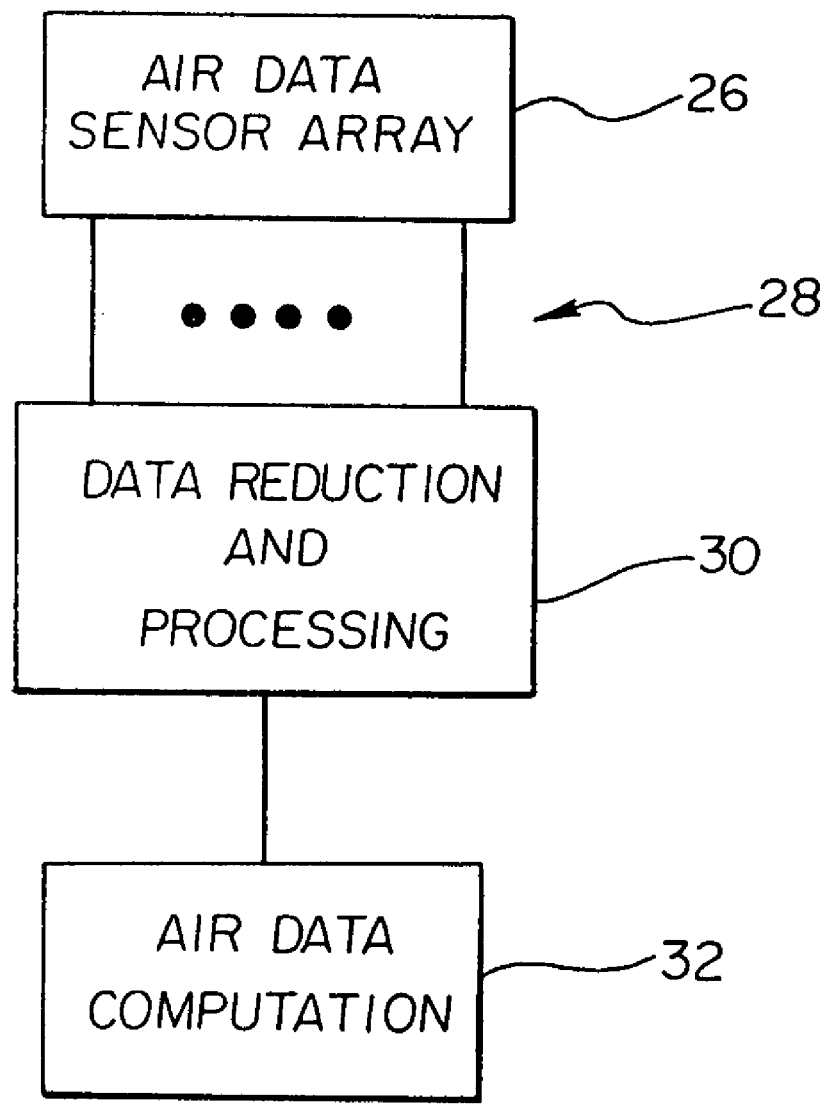
FIG. 5 is a simplified block diagram of a system interconnection useful in the practice of the present invention.
Figure 6:
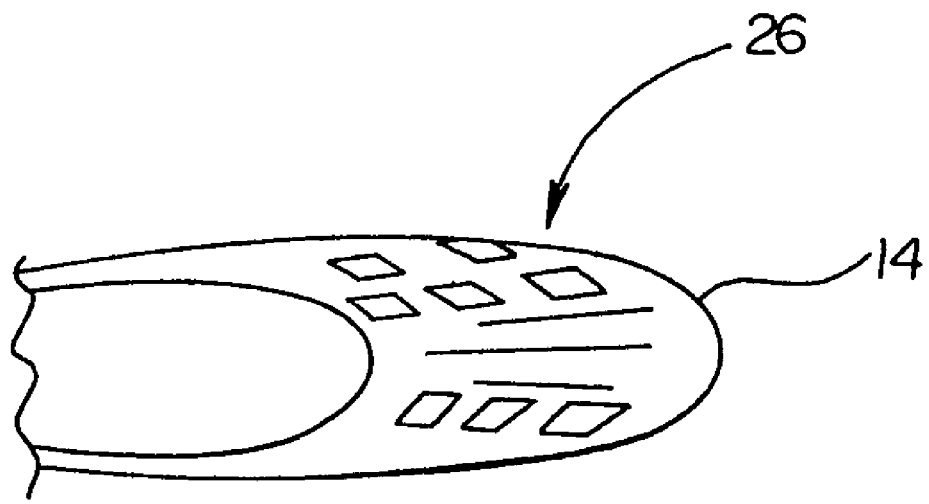
FIG. 6 is a side view of an airframe structure such as a wing carrying an array of air data sensors of the present invention.
Figure 7:
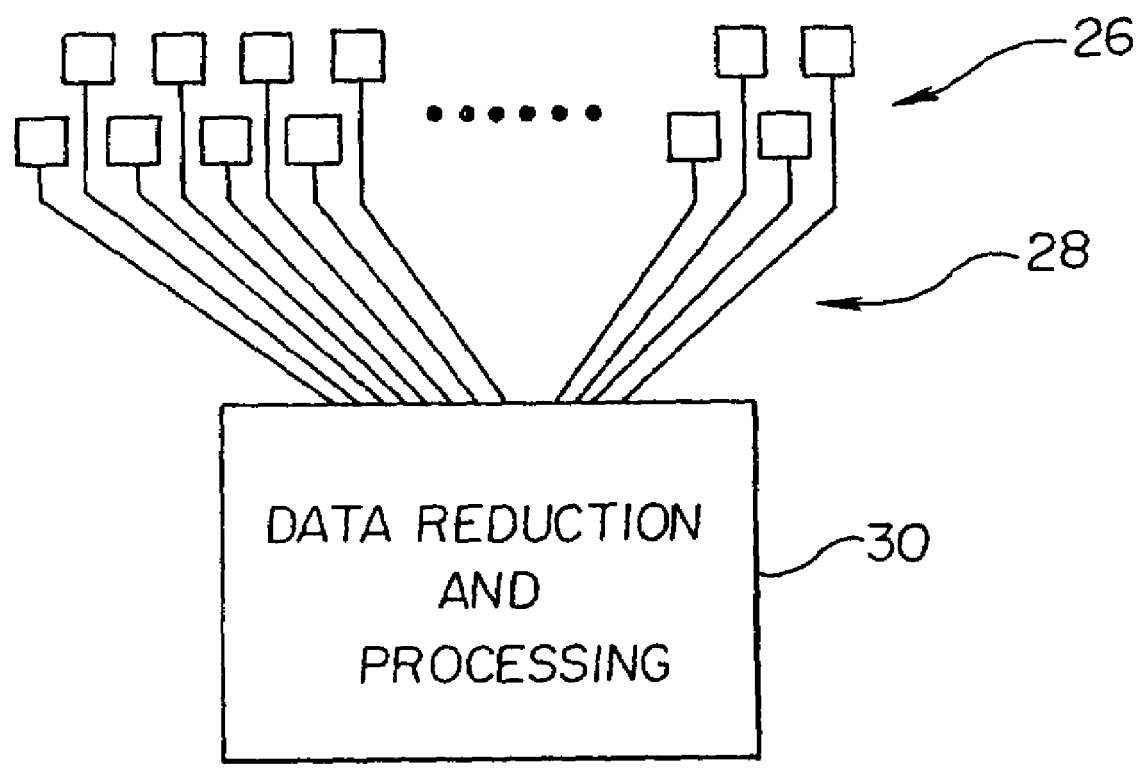
FIG. 7 is a simplified block diagram of the array of FIG. 6 connected to a data reduction and processing block similar to that shown in FIG. 5.

As shown in FIG. 5 in a preferred embodiment of the present invention, an array or plurality 26 of sensors such as sensor 20 are co-located below a fluoropolymer layer 34 having a total thickness of 6–10 mil. Such sensors could be temperature and pressure sensors, or other air data sensors, as desired. It is to be understood that temperature is necessary to correct the air pressure readings. One example of an absolute pressure transducer is disclosed in U.S. Pat. No. 5,808,210. The sensors provide data via a network of optical fibers in an optical fiber layer 28 to an electronic data reduction and processing block 30 (see FIGS. 5 and 7). The optical fiber layer 28 also can be used to provide power to the sensors 20. The resonating integrated microstructure sensors may be optically energized by an embedded photodiode located in the microbeam structure. As incident light is coupled to the sensor via an optical fiber and a collimating graded index lens, the photodiode establishes an "etalon effect" causing the microbeam to be excited into a resonant mode of operation. The principle of operation for the optical sense and drive for such a sensor is presented in U.S. Pat. No. 5,808,210.

The optical fibers in layer 28 may be collected and terminated in standard optical fiber cable connectors. The optical fiber cable connectors are connected to a universal signal conditioner and remote input/output unit in block 30. Block 30 converts the optical signals to air temperature and pressure signals, which are used by the Air Data Computation Block 32 to compute altitude and airspeed from the pressure and temperature according to well-known techniques.

The present invention may be used to provide a minimally invasive pressure measuring instrument for characterizing the boundary layer fluid flow on an aerodynamic surface such as an airplane wing or a inside turbo-machinery such as a turbine engine. By conforming closely to the contour of the surface to which it is attached, there will be minimal or even negligible effect on the fluid flow characteristics in the boundary layer being sensed.

In the practice of the present invention, the air data sensor (such as an air pressure sensor 20), a data communications network (in layer 28), data acquisition circuits 22 and mechanical support are all combined in a single ultra low profile conforming package 12. The package or patch 12 includes a conformal layer 34 for environmental protection which includes a plurality of ports or apertures 36. Layer 34 is preferably a fluoropolymer film such as that manufactured by the 3M Company of St. Paul, Minnesota under the product number 500 as aircraft paint replacement film in thicknesses of 3.5 to 10 mils. In addition to providing a protective cover, film 34 serves as a flexible layer for mounting the components of the system in a manner to be described infra.

Referring now again to FIG. 4, the instrument package 12 is preferably adhesively bonded to an airframe surface 38. An adhesive layer 40, preferably in the form of a pressure sensitive adhesive formed in a commercially available acrylate process to a thickness of about 1.5 mils initially has a backing or release layer (not shown) which is removed immediately prior to installation on the surface 38. The air data sensor 20, data acquisition circuit 22 and conformal rechargeable battery 24 are all preferably mounted on film 34 which eventually will form a conformable cover layer for the instrument package 12. It is to be understood that one or more sensors 20 (which may include pressure sensors and temperature sensors), circuit 22, and battery 24 are each connected electrically and mechanically to cover layer 34. The conformable assembly 12 is preferably about 6–10 mils thick, with layer 34 acting as a base for a flexible printed circuit, providing electrical interconnects and mechanical relief support, in addition to being an environmental cover. The flexible printed circuit on layer 34 is preferably a 1 mil thick conductive polymer thick film 41, deposited on the backside of layer 34 using stencil, screen printing, or ink-jet processing techniques. The electrical components and pressure sensor are preferably interconnected to the flexible printed circuit using conventional surface mounting techniques utilizing solder bumps 42. Additional mechanical support may be provided by adding a layer 44 of about 0.5 mils thick epoxy coating compound to bond the sensors 20 and related components to layer the polymer film layer 41 and cover layer 34.

The optical fiber layer 28 is a flexible substrate preferably formed of polyimide about 200 microns thick to provide optical interconnections between the sensors 20 and the data acquisition circuit 22 and to an optical fiber to waveguide coupler 46, which has a strain relief 48 for a multimode fiber optic cable 50 connecting the instrument package 12 to high temperature data processor 32 (see FIG. 5). Using fiber optic interconnects enhances electromagnetic interference immunity, by limiting effects to the local processing area only. It is to be understood that the data acquisition circuit 22 converts the optical signals to one or more (preferably digital) electrical signals for further processing.

Figure 8:
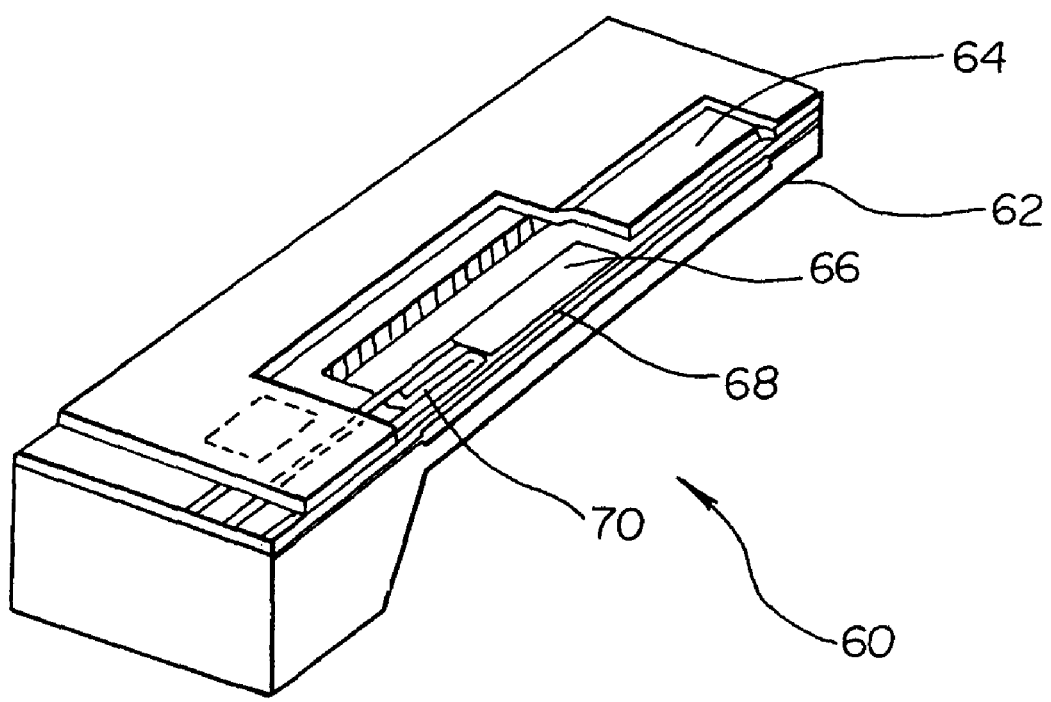
FIG. 8 is a simplified perspective view resonant microbeam sensor useful in the practice of the present invention.
Figure 9:
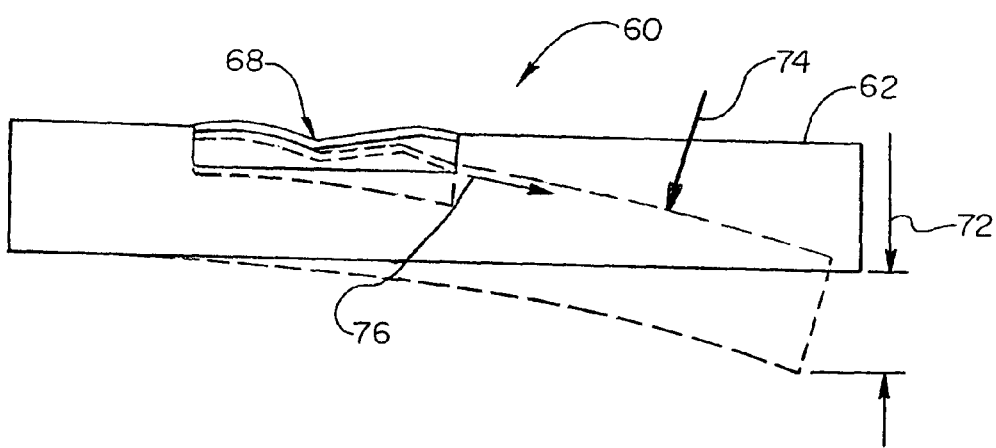
FIG. 9 is a side view of the sensor of FIG. 8 in a relaxed state and in a deflected state.
Figure 10:
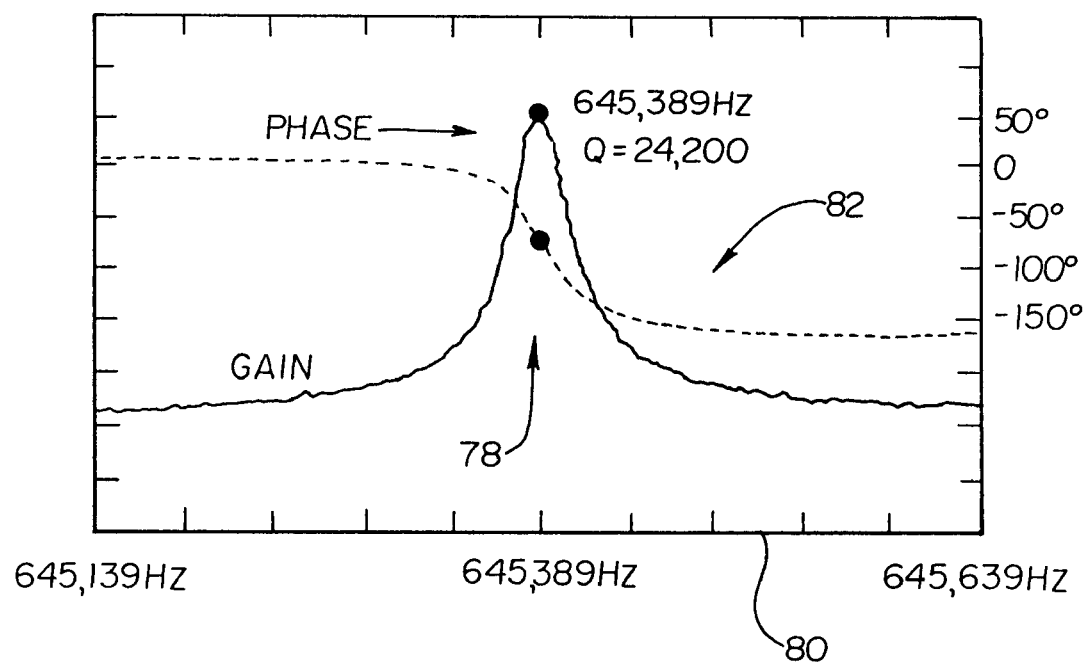
FIG. 10 is a plot of the gain and phase response versus frequency of the sensor shown in FIGS. 8 and 9.

Referring now to FIGS. 8, 9 and 10, certain aspects of one embodiment for the air data sensor 20 for sensing pressure may be seen. In FIGS. 8 and 9 a resonant microbeam sensor assembly 60 are illustrated. FIG. 8 is a partially cut away view of the sensor assembly 60 having a cantilever mounting arm 62 having a vacuum cavity enclosure 64, a drive electrode 66, a microbeam 68, and a sense resistor 70. As illustrated in FIG. 9, when the cantilever mounting arm 62 is deflected a distance 72 by an applied force 74, the resonating microbeam 68 will have a resulting axial force increase, indicated by arrow 76.

FIG. 10 shows the gain and phase response for the assembly 60. As force 74 is applied, the resonant frequency and frequency at which the phase shift occurs will change, with the frequency increasing with an increase in applied force. The change in air pressure sensed at port 36 results in a change in force 74 applied to arm 62, detected as a shift in the resonant frequency 78 along the abscissa or horizontal axis 80 of response characteristics 82 of the resonating microbeam 68.

The instrument package 12 is fabricated by creating the flexible printed circuit 41 on cover layer or film 42, after which components 20, 22, and 24 are electrically connected via solder connections 42. Epoxy layer or flexible potting compound 44 is applied to fill the spaces adjacent components 20, 22, and 24, and the optical fiber interconnect layer 28 with coupler 46 is attached to the components and epoxy layer. The coupler 46 and the pressure sensitive adhesive layer 40 may be attached to the flexible substrate layer 28 before or after assembly to the remainder of package 12.

Figure 11:
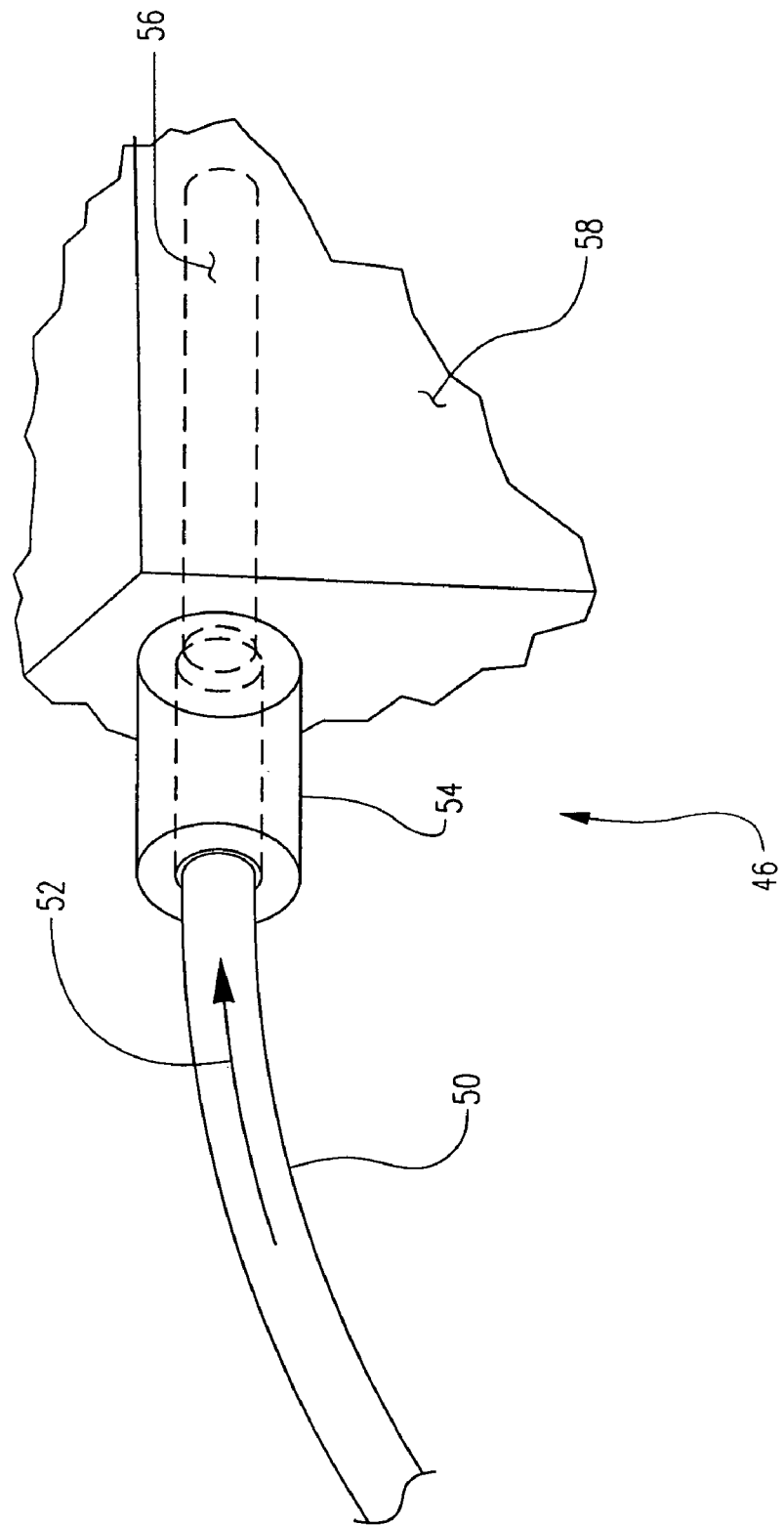
FIG. 11 is an enlarged view of an optical fiber interface useful in the practice of the present invention.

Referring now to FIG. 11, an enlarged view of an optical fiber interface or coupler 46 useful in the practice of the present invention may be seen. Optical fiber cable 50 is received in the strain relief 48 within a gradient index lens 54 which is optically coupled to an optical waveguide or etched cavity 56 in silicon chip subsystem 58. Incident light is indicated by arrow 52.

Referring now to FIG. 12, a simplified view of a microbeam temperature sensor 90 useful in the practice of the present invention may be seen. The measurement of air temperature to provide correction of air pressure readings may be accomplished by incorporating an additional resonating integrated microstructure sensor 90 into the air data sensor system. Resonant microbeam temperature sensing is known from U.S. Pat. No. 5,772,322. The structure for temperature sensor 90 includes a conforming metallization layer 92 of a precious metal such as gold or platinum applied to one side 94 of a bulk silicon cantilever beam 96 via a sputtering process or equivalent semiconductor method. The coefficients of thermal expansion of the two dissimilar layers causes the mechanical stiffness of the cantilever beam 96 to change according to the temperature to which the beam 96 is exposed. The air data and temperature sensor 90 is preferably packaged as an array of two active devices located adjacent to each other on a common silica substrate 98. Beam 96 also preferably carries resonating integrated microstructure 100. The active devices are interrogated by a further optical fiber (not shown) co-located with the air pressure optical fiber 50 at the end of the conformal sensor package 12. Static compensation of resonant microbeam sensor technology is disclosed in U.S. Pat. No. 5,458,000.

In practice, the instrument package 12 of the present invention may be fabricated and stored in roll form with the release layer attached, until it is desired to install the package 12 on an airframe member, at which time the package and release layer is unrolled, the release layer removed, and the package or patch 12 applied by hand pressure to the surface adjacent which air data is to be taken. The cable 50 is preferably connected via conventional fiber optic cable connectors to data processing equipment (not shown) to provide air data for the boundary layer adjacent the surface to which patch 12 is attached. The overall thickness of instrument package 12 is about 10 mils or 0.010 inches thick.

This invention is not to be taken as limited to all of the details thereof as modifications and variations thereof may be made without departing from the spirit or scope of the invention. For example, the present invention may be used to advantage on an interior surface of a turbine engine or other structure requiring streamlined airflow. Furthermore, the present invention may be used in conventional gaseous fluid flow structures such as process equipment and space heating.

What is claimed is:

1. A method of fabricating an air data sensor assembly comprising the steps of:
   a. forming a flexible printed circuit on a polymeric film having at least one aperture in the film and flexible printed circuit;
   b. attaching a relatively thin air data sensor to the flexible circuit adjacent to and in fluid communication with the aperture; and
   c. attaching a flexible substrate having an adhesive layer to the air data sensor and flexible printed circuit resulting in a conformable air data sensor assembly for sensing an air parameter in the air adjacent the polymeric film using the air data sensor via the aperture.

2. The method of claim 1 further comprising an additional step b1 between steps a and c:
   b1. attaching a data acquisition circuit to the flexible printed circuit.

3. The method of claim 2 wherein step c further comprises providing an optical interconnection between the air data sensor and the data acquisition circuit.

4. The method of claim 1 wherein steps a, b, and c are performed to result in a plurality of conformable air data sensor assemblies, and wherein the method further comprises:
   d. storing the plurality of assemblies in roll form.

5. The method of claim 1 wherein steps a, b, and c are performed to result in a plurality of conformable air data sensor assemblies, and wherein the method further comprises:
   d. storing the plurality of assemblies in roll form with a release layer attached to the adhesive layer.

6. The method of claim 1 further including a step of:
   d. initially attaching a release layer to the adhesive layer.

7. The method of claim 6 further including the following steps of:
   e. subsequently removing the release layer; and
   f. installing the conformable air data sensor assembly on a surface for which air data in a boundary layer adjacent the surface is to be sensed.

8. The method of claim 1 wherein step b further includes electrically connecting the air data sensor to the flexible circuit using one or more solder connections.

9. The method of claim 1 wherein the air data sensor further includes a pressure sensor.

10. The method of claim 9 wherein the air data sensor further includes a temperature sensor.

11. The method of claim 9 wherein the air data sensor further includes a data acquisition circuit.

12. The method of claim 11 wherein the air data sensor still further includes a battery.

13. The method of claim 1 wherein step b includes electrically connecting a plurality of components to the flexible printed circuit.

14. The method of claim 13 wherein at least some of the plurality of components have spaces adjacent thereto, and the method further comprises a step of:
   d. filling the spaces with epoxy or flexible potting compound.

15. The method of claim 14 further comprising the step of:
   e. attaching an optical fiber interconnect layer to at least one of the components.

16. The method of claim 15 wherein step e further comprises forming the optical fiber interconnect layer from a polyimide providing optical interconnections between the components.

17. The method of claim 15 wherein the optical fiber interconnect layer includes an optical fiber to waveguide coupler.

18. The method of claim 17 wherein the coupler and adhesive layer are attached to the flexible substrate before assembly of the remainder of the conformable air data sensor assembly.

19. The method of claim 18 wherein the coupler and adhesive layer are attached to the flexible substrate after assembly of the remainder of the conformable air data sensor assembly.

20. The method of claim 1 wherein step a further comprises depositing a polymer thick film on a back side of the polymeric film using a stencil, screen printing, or ink-jet processing technique.

21. The method of claim 1 further comprising the additional step of:
   d. applying pressure between the conformable air data sensor assembly and a surface adjacent which air data is to be taken such that the air data sensor assembly closely conforms to the surface to which it is attached.

22. The method of claim 21 wherein a release layer is initially attached to the adhesive layer further comprising the additional step before step d of:
   d. removing the release layer from the adhesive layer.

* * * * *